(12) United States Patent
Joo et al.

(10) Patent No.: US 9,893,706 B2
(45) Date of Patent: Feb. 13, 2018

(54) TWO-STAGE NOISE FILTER AND ELECTRONIC DEVICE INCLUDING THE SAME

(71) Applicant: SAMSUNG ELECTRONICS CO., LTD., Suwon-si (KR)

(72) Inventors: Sung-yong Joo, Yongin-si (KR); Jin-hyung Lee, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 72 days.

(21) Appl. No.: 14/804,883

(22) Filed: Jul. 21, 2015

(65) Prior Publication Data

US 2016/0020745 A1 Jan. 21, 2016

(30) Foreign Application Priority Data

Jul. 21, 2014 (KR) ........................ 10-2014-0091826

(51) Int. Cl.
| | |
|---|---|
| *H03H 7/09* | (2006.01) |
| *H03H 7/38* | (2006.01) |
| *H01F 17/06* | (2006.01) |
| *H01F 19/04* | (2006.01) |
| *H03H 7/42* | (2006.01) |
| *H03H 1/00* | (2006.01) |
| *H01F 17/00* | (2006.01) |

(52) U.S. Cl.
CPC .............. *H03H 7/09* (2013.01); *H01F 17/06* (2013.01); *H01F 19/04* (2013.01); *H03H 1/00* (2013.01); *H03H 7/38* (2013.01); *H03H 7/427* (2013.01); *H01F 2017/0093* (2013.01); *H03H 1/0007* (2013.01); *H03H 2001/0035* (2013.01)

(58) Field of Classification Search
CPC H03H 7/09; H03H 7/38; H03H 7/383; H03H 1/0007; H03H 2001/0035; H03H 2001/005; H03H 2001/0092; H03H 7/427
USPC ............................ 333/12, 32, 177, 181, 185
See application file for complete search history.

(56) References Cited

U.S. PATENT DOCUMENTS

| | | | | |
|---|---|---|---|---|
| 4,910,482 A | * | 3/1990 | Takagai | ................. H01F 38/02 333/12 |
| 5,422,619 A | * | 6/1995 | Yamaguchi | ............ H01F 17/04 336/181 |

(Continued)

FOREIGN PATENT DOCUMENTS

| | | |
|---|---|---|
| KR | 93-16653 U | 7/1993 |
| KR | 1993-0015318 A | 7/1993 |

(Continued)

Primary Examiner — Rakesh Patel
(74) Attorney, Agent, or Firm — Sughrue Mion, PLLC

(57) ABSTRACT

Disclosed are a two-stage noise filter, in which two filters are integrated, and an electronic device including the same. The two-stage noise filter includes a core configured to include a primary side and a secondary side opposite to the primary side; a first filter configured to include a first coil wound on the primary side of the core and a second coil wound on the secondary side of the core; a second filter configured to include a third coil wound on the primary side of the core in series with the first coil and a fourth coil wound on the secondary side of the core in series with the second coil; and an impedance balancer configured to keep a balance of impedance between the first and second filters.

8 Claims, 8 Drawing Sheets

(56) References Cited

U.S. PATENT DOCUMENTS

| | | | |
|---|---|---|---|
| 2003/0078005 A1* | 4/2003 | Recht | H01F 3/10 333/12 |
| 2010/0289467 A1* | 11/2010 | Wu | H02M 3/33523 323/282 |
| 2012/0223797 A1* | 9/2012 | Won | H01F 27/325 336/170 |
| 2015/0188509 A1* | 7/2015 | Paepoot | H02H 9/005 333/181 |

FOREIGN PATENT DOCUMENTS

| KR | 2002-0009725 A | 2/2002 |
|---|---|---|
| KR | 10-2011-0010052 A | 1/2011 |

* cited by examiner

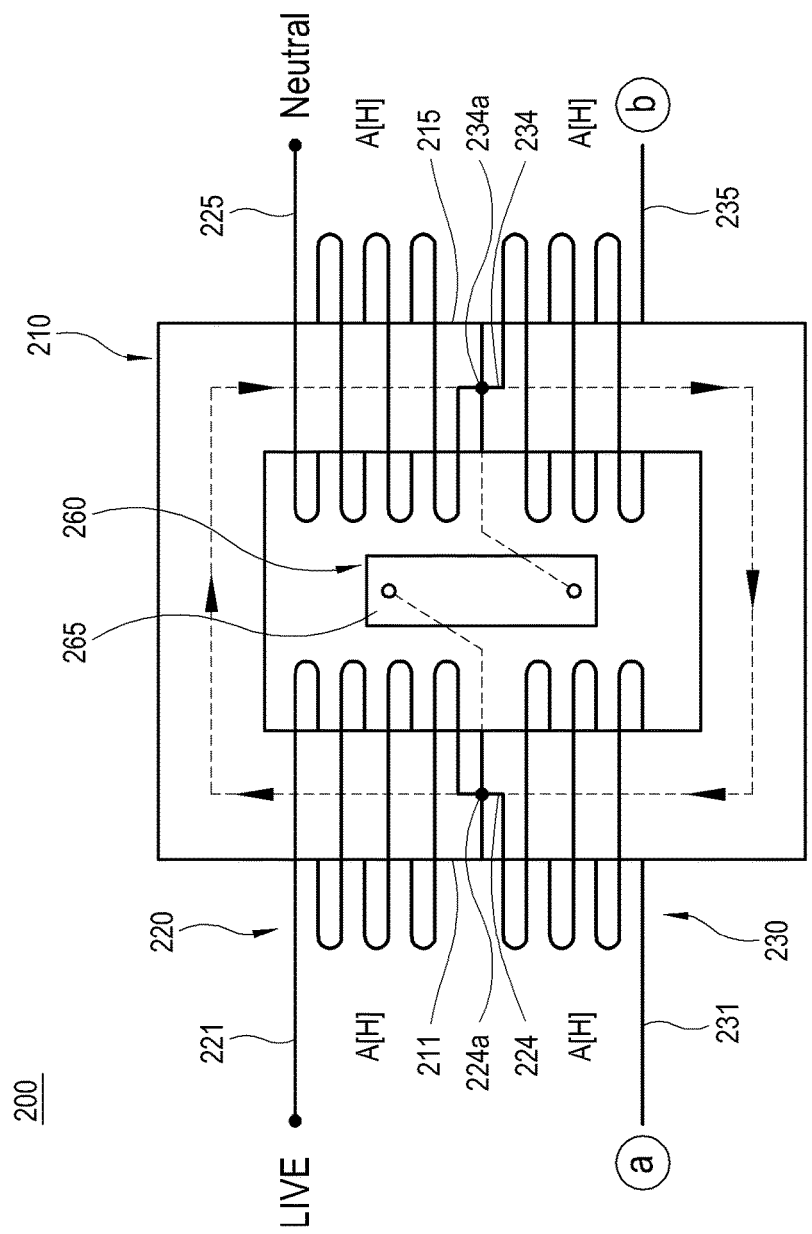

TWO-STAGE NOISE FILTER AND ELECTRONIC DEVICE INCLUDING THE SAME

CROSS-REFERENCE TO RELATED APPLICATION

This application claims priority from Korean Patent Application No. 10-2014-0091826, filed on Jul. 21, 2014 in the Korean Intellectual Property Office, the entire disclosure of which is incorporated herein by reference.

BACKGROUND

Field

Apparatuses and methods consistent with exemplary embodiments relate to a noise filter and an electronic device including the same, and more particularly to a two-stage noise filter and an electronic device including the same, in which two filters are integrated.

Description of Related Art

There are two kinds of noise, radiated noise and conducted noise. Radiated noise propagates through the atmosphere, and conducted noise propagates through a transmission line, such as a power line, a signal line, a ground line, etc., of an electronic device. Conducted noise is classified into common-mode noise C that propagates between the power line and the ground line, and normal-mode noise N that reciprocates between the power lines, as shown in FIG. 1.

Accordingly, a general electronic device includes a common-mode noise filter for filtering off the common-mode noise caused in the ground line, and a normal-mode noise filter for filtering off the normal-mode noise caused in the power line, thereby reducing electromagnetic interference (EMI) due to the noise.

In particular, the common-mode noise filter employs a one-stage noise filter or a two-stage noise filter where two one-stage noise filters are coupled, in accordance with mounted loads of the electronic device.

As shown in FIG. 2, the two-stage noise filter 1 is usually provided in a switching power supply (SPS) of the electronic device, and includes first and second filters 10 and 20, and a capacitor 30 arranged in between the first and second filters 10 and 20.

The first filter 10 includes first and second coils 11 and 13, and a first core 17 on which the first and second coils 11 and 13 are wound, and the second filter 20 includes third and fourth coils 21 and 23, and a second core 27 on which the third and fourth coils 21 and 23 are wound. The first to fourth coils 11, 13, 21 and 23 generate induced electromotive force based on variance in a supplied amount of electric current.

As shown in FIG. 3, the capacitor 30 is arranged in parallel between a connection line 15 of the first and third coils 11 and 21 and a connection line 25 of the second and fourth coils 13 and 23. The capacitor 30 serves to limit an electric current, which has a predetermined frequency and flows in between the first and third coils 11 and 21 and between the second and fourth coils 13 and 23, from exceeding a predetermined amount. First ends 11a and 13a of the first and second coils 11 and 13 are connected to power P. Second ends 21b and 23b of the third and fourth coils 21 and 23, which are opposite to first ends 21a and 23a, are connected to a load L via a rectifier or the like of the switching power supply (SPS).

Thus, when an alternating current (AC) having a predetermined frequency flows in between the first and third coils 11 and 21, and between the second and fourth coils 13 and 23, magnetic flux occurs in the first and second cores 17 and 27 by electromagnetic induction along arrows, as shown in FIG. 4. This magnetic flux suppresses the common-mode noise in the first and second cores 17 and 27.

However, such a conventional two-stage noise filter 1 increases the number of parts, the size and an occupied space because the first and second filters 10 and 20 are individually manufactured and respectively mounted on to a printed circuit board 30, thereby causing a complicated structure, increasing required man hours and raising manufacturing costs. Further, an electronic device with the conventional two-stage noise filter 1 has a limit to its miniaturization.

SUMMARY

Methods and apparatuses consistent with exemplary embodiments relate a two-stage noise filter and an electronic device including the same, in which one core is shared by two filters, thereby decreasing the number of parts, the size and an occupied space, and thus simplifying its structure, reducing manufacturing costs and miniaturizing the electronic device.

In accordance with an aspect of an exemplary embodiment, there is provided a two-stage noise filter including a core including a primary side and a secondary side opposite to the primary side; a first filter including a first coil wound on the primary side of the core and a second coil wound on the secondary side of the core; a second filter including a third coil wound on the primary side of the core in series with the first coil and a fourth coil wound on the secondary side of the core in series with the second coil; and an impedance balancer configured to keep a balance of impedance between the first filter and the second filter.

In the two-stage noise filter, the first coil and the third coil may define a first magnetic flux path at the primary side of the core when an electric current flows therein, the second coil and the fourth coil may define a second magnetic flux path, and the first magnetic flux path and the second magnetic flux path may form a single closed-loop when an electric current flows therein.

The impedance balancer may be located in a middle space of the core.

The impedance balancer may be arranged between the primary side and the secondary side.

The two-stage noise filter may further include a first connection line connecting the first coil to the third coil; and a second connection line connecting the second coil to the fourth coil, and the impedance balancer may include a capacitor connected in parallel between the first connection line and the second connection line.

A first end of the first coil may be electrically connected to a first filter input, a second end of the third coil may be electrically connected to a first filter output, a first end of the second coil may be electrically connected to a second filter output, and a second end of the fourth coil is electrically connected to a second filter input, a first conduction path may be defined from the first filter input to the first filter output, and a second conduction path may be defined from the second filter input to the second filter output.

A first side of the impedance balancer may be directly connected to a second end of the first coil and a first end of the third coil, and a second side of the impedance balancer may be directly connected to a second side of the second coil and a first end of the fourth coil.

In accordance with another exemplary embodiment, there is provided a two-stage noise filter including a core including a primary side and a secondary side opposite to the primary side; a first filter including a first coil wound on the primary side of the core and a second coil wound on the secondary side of the core; a second filter including a third coil wound on the primary side of the core and a fourth coil wound on the secondary side of the core; and an impedance balancer arranged in between the primary and secondary sides of the core and configured to keep a balance of impedance between the first filter and the second filter.

The impedance balancer may be arranged in a middle space of the core.

The first coil and the third coil may be connected in series by a first connection line, the second coil and the fourth coil may be connected in series by a second connection line, and the impedance balancer may include a capacitor connected in parallel between the first connection line and the second connection line.

In accordance with still another exemplary embodiment, there is provided an electronic device including a power circuit configured to generate power; and a two-stage noise filter configured to suppress noise caused by power and ground lines of the power circuit. The two-stage noise filter includes: a core comprising a primary side and a secondary side opposite to the primary side; a first filter comprising a first coil wound on the primary side of the core and a second coil wound on the secondary side of the core; a second filter comprising a third coil wound on the primary side of the core in series with the first coil and a fourth coil wound on the secondary side of the core in series with the second coil; and an impedance balancer configured to keep a balance of impedance between the first filter and the second filter.

BRIEF DESCRIPTION OF THE DRAWINGS

The above and/or other aspects will become apparent and more readily appreciated from the following description of exemplary embodiments, taken in conjunction with the accompanying drawings, in which:

FIG. 8 is a schematic view showing a circulating direction of magnetic flux in a core of first and second filters in the two-stage noise filter shown in FIG. 7.

DETAILED DESCRIPTION OF EXEMPLARY EMBODIMENTS

Below, a two-stage noise filter according to exemplary embodiments and an electronic device including the same will be described with reference to accompanying drawings.

Expressions such as "at least one of," when preceding a list of elements, modify the entire list of elements and do not modify the individual elements of the list.

Figure 1:
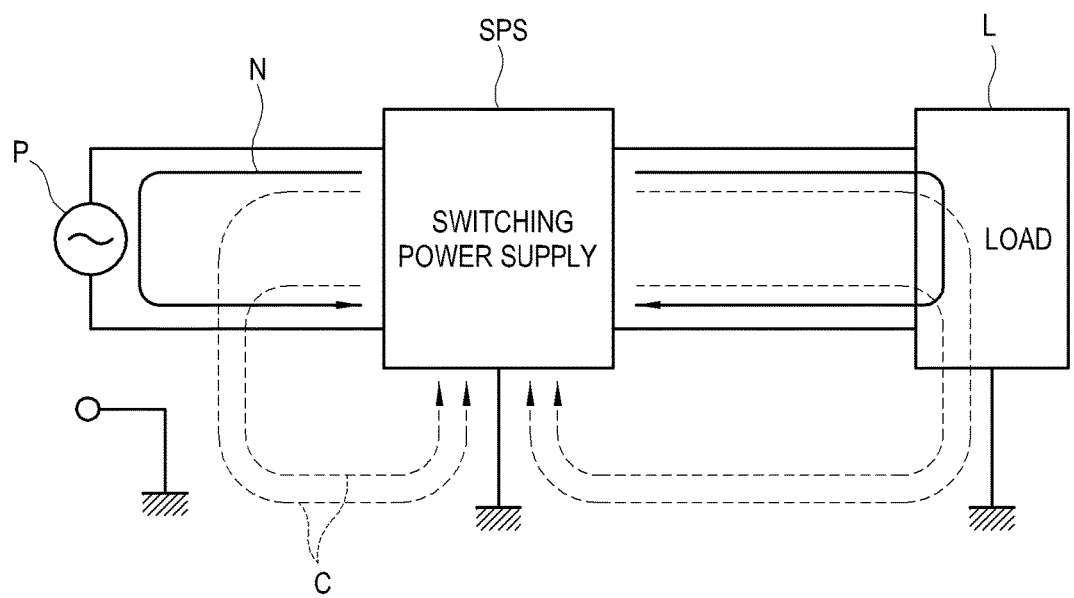
FIG. 1 is a schematic circuit diagram showing circulation of common-mode noise and normal-mode noise.
Figure 2:
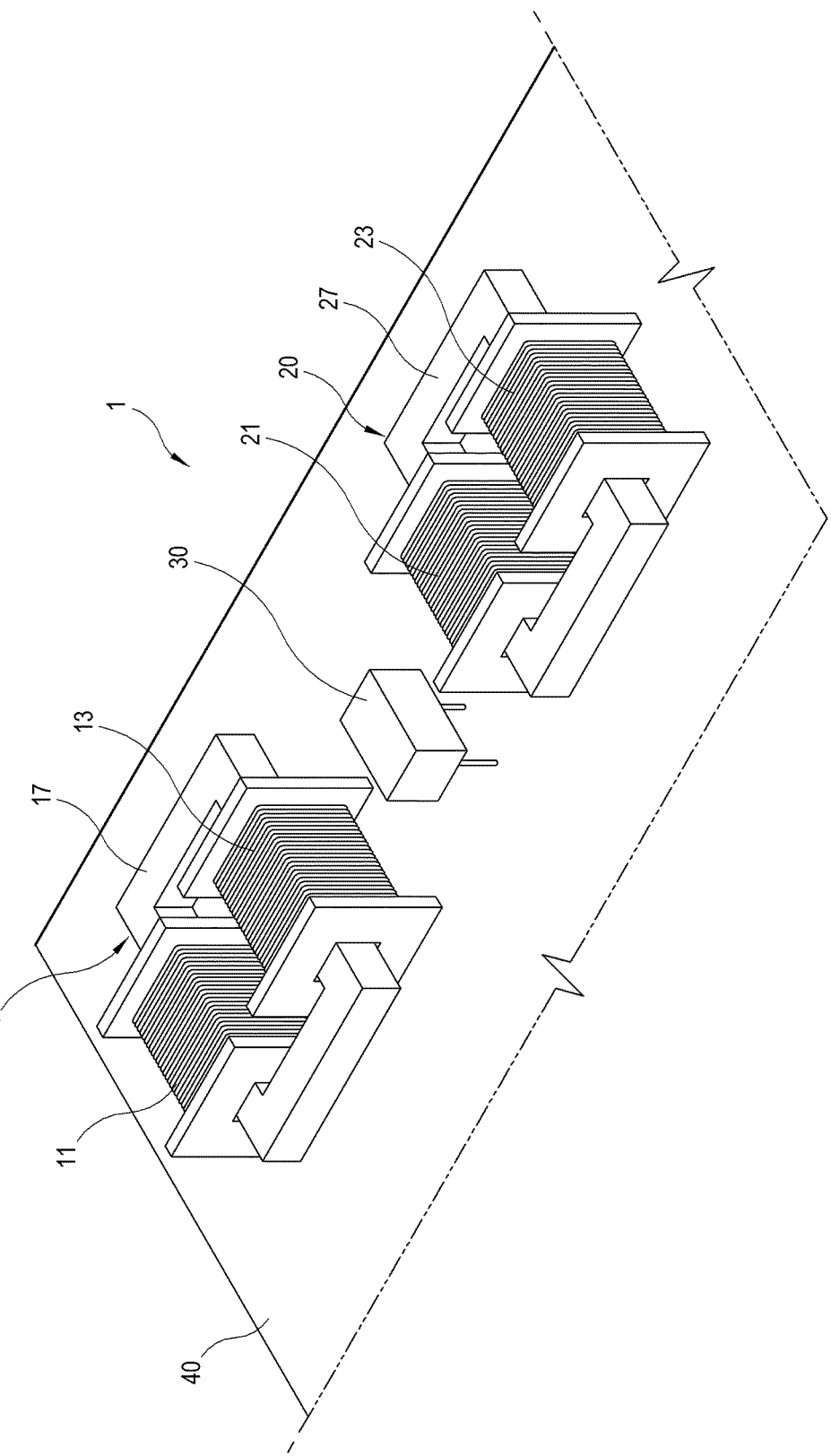
FIG. 2 is a perspective view showing a conventional two-stage noise filter mounted to a printed circuit board.
Figure 3:
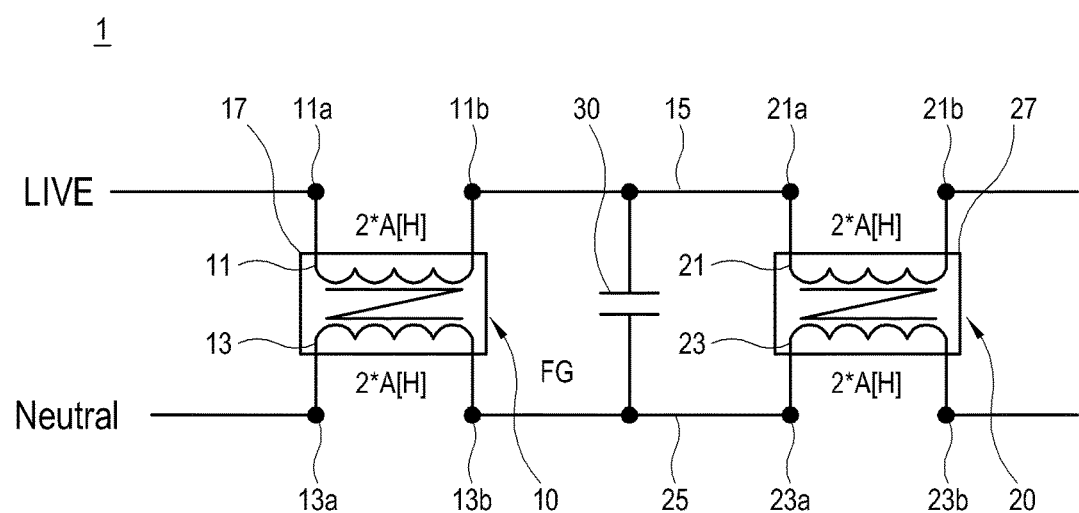
FIG. 3 is a circuit diagram of the conventional two-stage noise filter shown in FIG. 2
Figure 4:
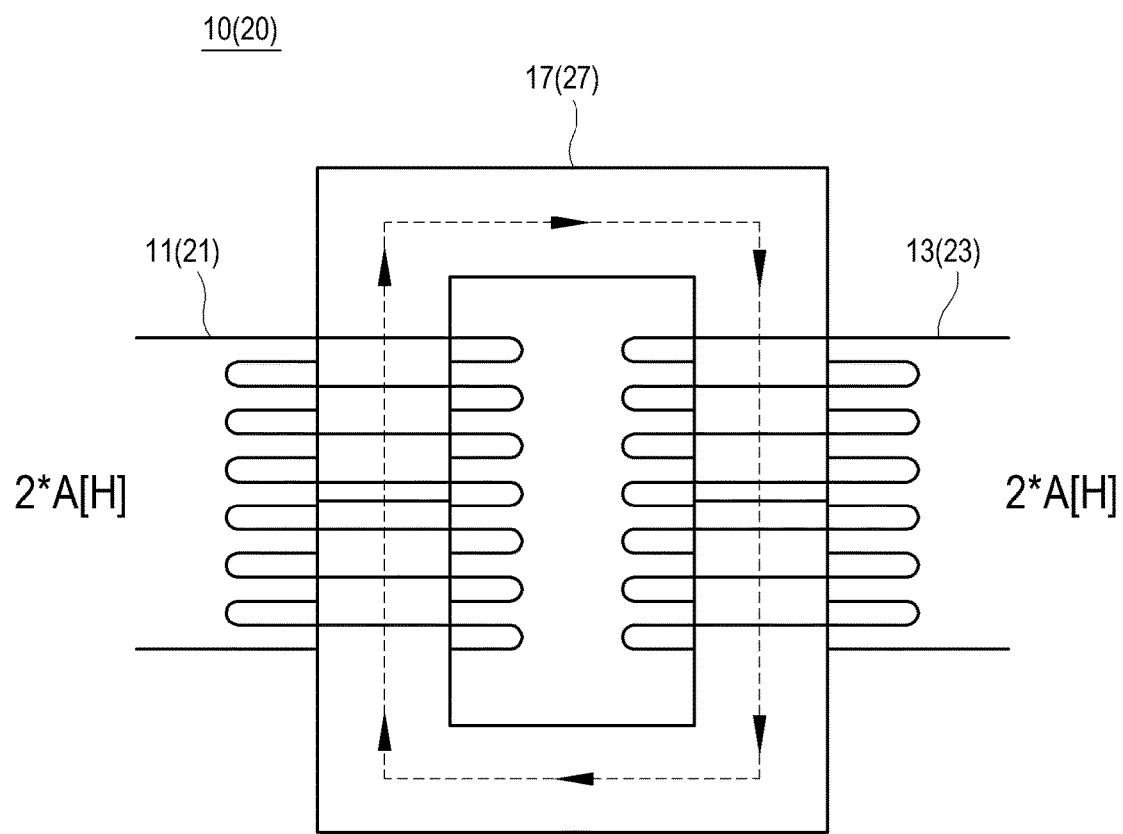
FIG. 4 is a schematic view showing a circulating direction of magnetic flux in first and second cores of first and second filters in the two-stage noise filter shown in FIG. 3.
Figure 5:
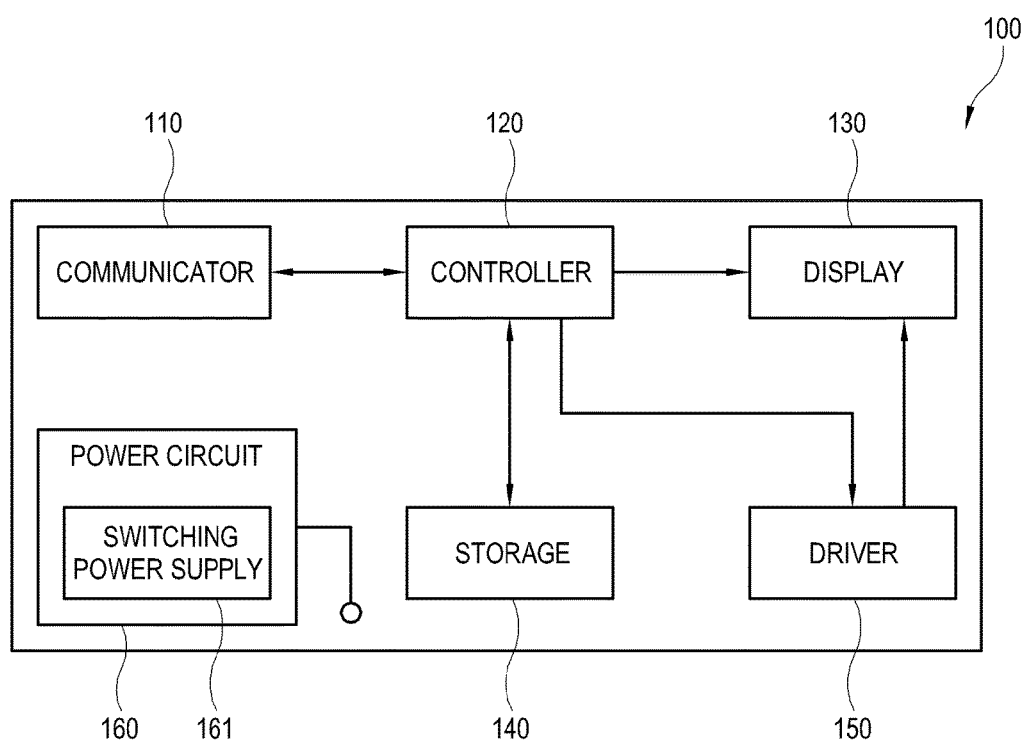
FIG. 5 is a block diagram schematically showing an electronic device including a two-stage noise filter according to an exemplary embodiment.

FIG. 5 is a block diagram schematically showing an electronic device with a two-stage noise filter according to an exemplary embodiment.

The electronic device 100 according to an exemplary embodiment is an electronic device with a two-stage noise filter capable of suppressing EMI noise of a power circuit. The electronic device 100 may be, for example, a display device, a set-top box (STB), a personal computer, a notebook computer, a home appliance or other similar electronic device.

In the following description, a display device, such as a television (TV), will be described as an example of the electronic device.

The electronic device 100 includes a communicator 110, a controller 120, a driver 150, a storage 140, a display 130, and a power circuit 160.

The communicator 110 communicates to transmit or receive a signal. The communicator 110 may communicate with an external service providing server and/or site through Internet, or may communicate with an external remote controller, an electronic device, or the like through a wired or wireless connection. The communicator 110 may be achieved by one or more modules for short-range wireless communication using various standards, for example, Wi-Fi, Bluetooth, IrDA, ZigBee, wireless local area network (WLAN), ultra-wideband (UWB).

The controller 120 controls the electronic device 100 to operate in response to a signal received through the communicator 110.

The driver 150 performs a predetermined operation for driving a light emitting diode (LED), or the like, of the display 130 under control of the controller 120.

The storage 140 stores, for example, information received through the communicator 110, information needed for operation of the driver 150, a program for controlling the electronic device 100, etc. The storage 140 may be achieved by at least one type of storage medium, such as a flash memory type, a hard disk, a multimedia card e.g., a secure digital (SD) or XD memory, a random access memory (RAM), a static random access memory (SRAM), a read-only memory (ROM), an electrically erasable programmable read-only memory (EEPROM), a programmable read-only memory (PROM), a magnetic memory, a magnetic disc and an optical disc.

The display 130 displays an image. The display 130 may be achieved by a liquid crystal display (LCD), an organic light emitting diode), an active matrix organic light emitted diode (AMOLED) or other flat display panel.

The power circuit 160 receives external power and supplies power needed for operating the foregoing elements 110, 120, 150, 140, 130 and 160.

Figure 6:
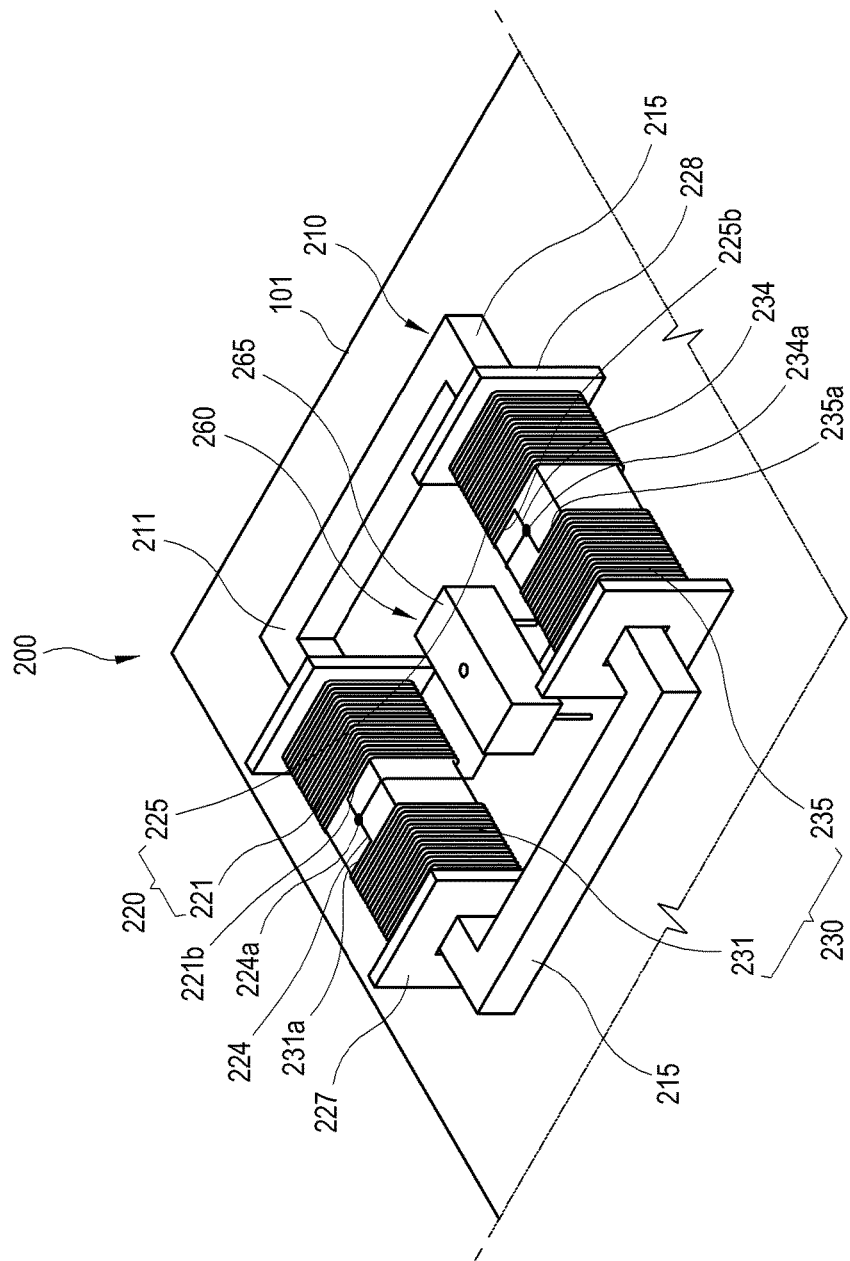
FIG. 6 is a perspective view schematically showing a two-stage noise filter mounted on to a printed circuit board, according to an exemplary embodiment.

As illustrated in FIG. 6, the power circuit 160 is provided on a printed circuit board 101 and includes a switching power supply 161 with a two-stage noise filter 200, according to an exemplary embodiment.

The switching power supply 161 rectifies an AC signal from an AC power source into a direct current (DC) through a bridge diode or similar rectifier; converts the DC into an AC having a pulse wave by high-speed switching of a semiconductor device, such as a transistor, a metal oxide semiconductor field effect transistor (MOSFET), etc.; and transforms the converted AC to have voltages needed for the foregoing elements 110, 120, 150, 140, 130 and 160, through a high-frequency transformer.

Referring to FIG. 6, the two-stage noise filter 200 is a filter for suppressing EMI noise that occurs in the switching power supply 161 of the power circuit 160, and includes a core 210, a first filter 220, a second filter 230 and an impedance balancer 260.

The core 210 is provided for the first and second filters 220 and 230 and achieved by a single hollow rectangular member having a primary side 211 and a secondary side 215 opposite to the primary side 211. Thus, the two-stage noise filter 200 includes a smaller number of parts, is physically smaller, and occupies a smaller amount of space than the conventional two-stage noise filter that has first and second cores respectively corresponding to the first and second filters. Thus, it is possible to simplify a structure, decrease required man hours, and reduce manufacturing costs. It is also possible to further miniaturize the electronic device 100 including the two-stage noise filter 200.

The core 210 is made of a material that is readily magnetized in a weak magnetic field, largely varies in magnetic flux density depending on minute changes in the magnetic field, and decreases in a remaining magnetic flux corresponding to decrease of the magnetic field. In this exemplary embodiment, the core 210 may be made of ferrite, a magnetic substance containing an iron compound. Alternatively, the core 210 may be made of other materials, such as pure iron, silicon steel, silicon steel strip, iron-aluminum alloy, iron-silicon-aluminum alloy, iron-nickel alloy or other similar material.

The first filter 220 includes the first and second coils 221 and 225. The first and second coils 221 and 225 are made of a conducting wire that generates a magnetic flux when an electric current flows through the coils. In this exemplary embodiment, the first and second coils 221 and 225 may be made of a metal wire, such as a copper wire, coated with enamel or similar insulating material.

The first and second coils 221 and 225 are respectively wound on upper sides of first and second bobbins 227 and 228 provided in the primary and secondary sides 211 and 215 (refer to FIGS. 6 and 8) of the core 210 and have regular pitches, thereby causing predetermined inductance L (A(H)) when an electric current flows therein.

The first and second bobbins 227 and 228 are made of a material that is not easily damaged by heat and has high insulation resistance. In this exemplary embodiment, the first and second bobbins 227 and 228 may be achieved by a tube of paper or a rectangular box of resin such as bakelite.

The second filter 230 includes third and fourth coils 231 and 235. Like the first and second coils 221 and 225, the third and fourth coils 231 and 235 are made of a conducting wire, such as a copper wire coated with enamel or similar insulating material, and wound on lower sides of the first and second bobbins 227 and 228, which are made of a high-frequency insulating material and provided in the primary and secondary sides 211 and 215 of the core 210, thereby causing predetermined inductance L (A(H)) when an electric current flows therein.

Figure 7:
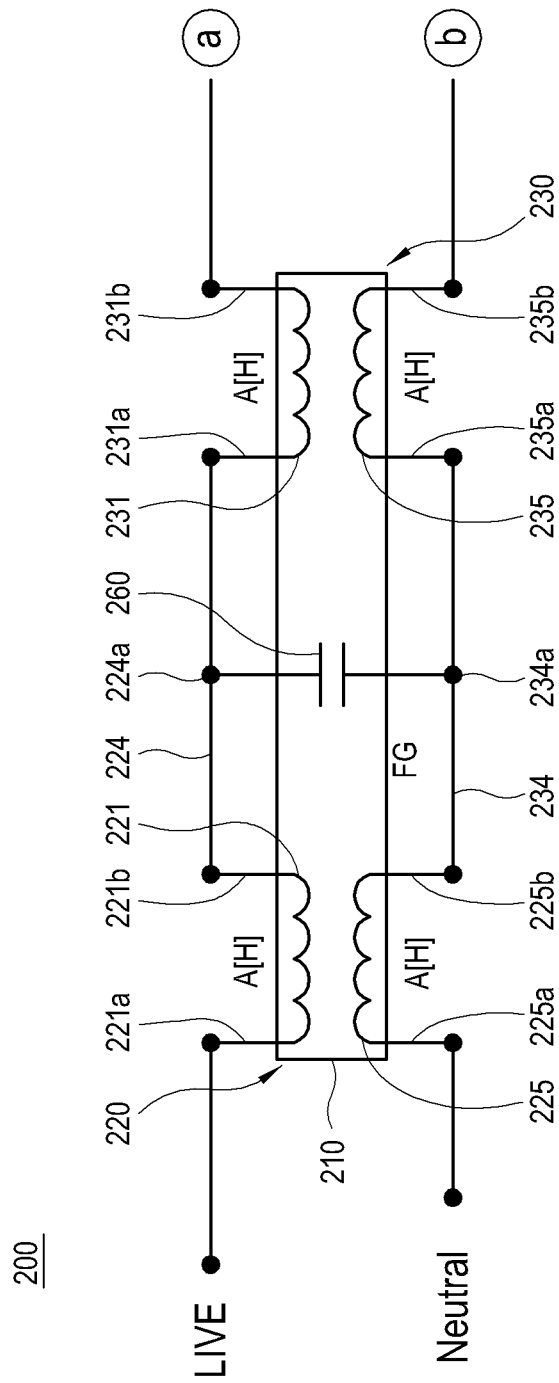
FIG. 7 is a circuit diagram of the two-stage noise filter shown in FIGS. 6.

As shown in FIG. 7, a second end 221b of the first coil 221 connects with a first end 231a of the third coil 231 at a junction 224a by the connection line 224, so that the first and third coils 221 and 231 can be connected in series to each other. A first end 221a of the first coil 221 is electrically connected to a first filter input LIVE, and a second end 231b of the third coil 231, which is opposite to the first end 221a of the first coil 221, is electrically connected to a first filter output a.

Likewise, a second end 225b of the second coil 225 connects with a first end 235a of the fourth coil 235 at a junction 234a by the connection line 234, so that the second and fourth coils 225 and 235 can be connected in series to each other. A first end 225a of the second coil 225 is electrically connected to a second filter output Neutral, and a second end 235b of the fourth coil 235, which is opposite to the first end 225a of the second coil 225, is electrically connected to a second filter input b.

The first filter input LIVE and the second filter output Neutral may, for example, be connected to the AC power source, and the first filter output a and the second filter input b may be connected to the rectifier of the switching power supply 161 supplying voltages needed for the elements 110, 120, 150, 140, and 130, which constitute the load L of the power circuit 160.

With this configuration, the first to fourth coils 221, 225, 231 and 235 may be impregnated and fixed with a liquid insulating material after the first and second bobbins 227 and 228 respectively wound with the first and third coils 221 and 231 and the second and fourth coils 225 and 235 are installed at the primary and secondary sides 211 and 215 of the core 210.

The impedance balancer 260 is provided in between the primary side 211 and the secondary side 215 at a middle space of the core 210 and keeps a balance of impedance between the first and second filters 220 and 230. Thus, it is possible to further reduce the size and the occupied space for the two-stage noise filter 200 and miniaturize the electronic device.

The impedance balancer 260 serves to prevent an electric current, which has a useful frequency equal to a rated frequency and flows in between the first and third coils 221 and 231 and between the second and fourth coils 225 and 235, from exceeding a predetermined amount.

In this exemplary embodiment, the impedance balancer 260 may be achieved by a capacitor 265 connected in parallel to the first junction 224a and the second junction 234a between the first connection line 224 connecting the first and third coils 221 and 231 and the second connection line 234 connecting the third and fourth coils 225 and 235. The capacitor 265 is provided to exhibit sufficiently-high impedance at the rated frequency.

Thus, impedance caused by the first and second coils 221 and 225 of the first filter 210 is balanced with impedance caused by the third and fourth coil 231 and 235 of the second filter 220.

As shown in FIG. 8, when an AC signal of the AC power source flows from the first filter input LIVE to the first filter output a, the first and third coils 221 and 231 generate induced electromotive force in the primary side 211 of the core 210 based on variance in the AC signal, and cause magnetic flux corresponding to a first magnetic flux path in the arrow direction.

Further, the AC signal passing through the load L of the power circuit 160 flows from the second filter input b to the second filter output Neutral. Therefore, the second and fourth coils 225 and 235 generate induced electromotive force in the secondary side 215 of the core 210 based on variance in the incoming current, and cause magnetic flux corresponding to a second magnetic flux path, which together with the first magnetic flux path forms a single closed loop, in the arrow direction. Such generated magnetic flux suppresses the common-mode noise in the core 210.

Since the load L exists between the first filter output a and the second filter input b, there is a phase shift between a current flowing in the first and third coils 221 and 231 and a current flowing in the second and fourth coils 225 and 235. Therefore, an interference current having another high frequency different from an useful frequency equal to the rated frequency may be applied to the first filter output a and the second filter input b. In this case, the capacitor 265 of the impedance balancer 260 temporarily stores the interference current so that the current having the useful frequency and flowing between the first and third coils 221 and 231 and between the second and fourth coils 225 and 235 cannot exceed a predetermined amount. As a result, a very small amount of interference current is generated in the first filter input LIVE and the second filter output Neutral. Thus, the impedance caused by the first and second coils 221 and 225 of the first filter 220 is balanced with the impedance caused by the third and fourth coil 231 and 235 of the second filter 230 at the useful frequency.

As described above, the two-stage noise filter 200 according to an exemplary embodiment and the electronic device 100 including the same share one core 210 between the first and second filters 220 and 230 and thus include a smaller number of parts, a smaller size and occupy a reduced amount of space compared to the conventional two-stage noise filter having separate cores. This design simplifies structure, decreases man hours and reduces manufacturing costs. Further, as the occupied space for the two-stage noise filter 200 is decreased, it is therefore possible to reduce the size of the electronic device 100 including the two-stage noise filter 200.

In the two-stage noise filter 200 according to an exemplary embodiment and an electronic device 100 including the same, the first and second coils 221 and 225 of the first filter 220 and the third and fourth coil 231 and 235 of the second filter 230 are respectively provided in primary and secondary sides 211 and 215 of the core 210, thereby forming a magnetic flux path of a single closed-loop. Therefore, the two-stage noise filter 200 can generate a higher impedance, as compared with the impedance of the conventional two-stage noise filter in which the first and second coils of the first filter and the third and fourth coils of the second filter are respectively provided in the primary side of the first core and the secondary side of the second core and make two separated magnetic flux paths, within the same time under the same size of core and the same winding number of coils. As a result, the inductance L (A(H)) of the two-stage noise filter 200 according to an exemplary embodiment is lower than that of the conventional two-stage noise filter.

Therefore, the two-stage noise filter 200 can have the same EMI filtering performance as the conventional two-stage noise filter even though it is designed to have less capacity, e.g., a half capacity, even as the size of the core and/or the winding number of coils are decreased. In this case, the two-stage noise filter 200 is designed to be smaller than the conventional two-stage noise filter, thereby decreasing its size and occupying less space. Accordingly, manufacturing cost of the two-stage noise filter 200 is reduced, and the size of the electronic device 100 to be mounted with the two-stage noise filter 200 is decreased.

In addition, according to an exemplary embodiment, the impedance balancer 260 is installed in the middle space of the core 210 and thus the two-stage noise filter 200 is decreased in the size and occupies less space than the conventional two-stage noise filter in which the impedance balancers are respectively installed in the cores. As a result, manufacturing costs of the two-stage noise filter 200 are further reduced, and the size of the electronic device 100 may also be reduced.

Although a few exemplary embodiments have been shown and described, it will be appreciated by those skilled in the art that changes may be made in these exemplary embodiments without departing from the principles and spirit of the present disclosure. Therefore, the foregoing has to be considered as illustrative only. The scope is defined in the appended claims and their equivalents. Accordingly, all suitable modification and equivalents may fall within the scope of the present disclosure.

What is claimed is:

1. A two-stage noise filter comprising:
a core comprising a primary side and a secondary side opposite to the primary side;
a first filter comprising a first coil wound on the primary side of the core and a second coil wound on the secondary side of the core;
a second filter comprising a third coil wound on the primary side of the core and a fourth coil wound on the secondary side of the core; and
an impedance balancer arranged in a middle space of the core and in between the primary and secondary sides of the core, and configured to keep a balance of impedance between the first filter and the second filter,
wherein the first coil and the third coil define a first magnetic flux path at the primary side of the core when a first electric current flows therein,
the second coil and the fourth coil define a second magnetic flux path, and
the first magnetic flux path and the second magnetic flux path form a single closed-loop when a second electric current flows therein.

2. The two-stage noise filter according to claim 1, wherein the first coil and the third coil are connected in series by a first connection line,
the second coil and the fourth coil are connected in series by a second connection line, and
the impedance balancer comprises a capacitor connected in parallel between the first connection line and the second connection line.

3. A two-stage noise filter comprising:
a core comprising a primary side and a secondary side opposite to the primary side;
a first filter comprising a first coil wound on the primary side of the core and a second coil wound on the secondary side of the core;
a second filter comprising a third coil wound on the primary side of the core in series with the first coil and a fourth coil wound on the secondary side of the core in series with the second coil; and
an impedance balancer located in a middle space of the core, and configured to keep a balance of impedance between the first filter and the second filter,
wherein the first coil and the third coil define a first magnetic flux path at the primary side of the core when a first electric current flows therein,
the second coil and the fourth coil define a second magnetic flux path, and
the first magnetic flux path and the second magnetic flux path form a single closed-loop when a second electric current flows therein.

4. The two-stage noise filter according to claim 3, wherein the impedance balancer is arranged between the primary side and the secondary side.

5. The two-stage noise filter according to claim 3, further comprising:
a first connection line connecting the first coil to the third coil; and
a second connection line connecting the second coil to the fourth coil, wherein the impedance balancer comprises a capacitor connected in parallel between the first connection line and the second connection line.

6. The two-stage noise filter according to claim 3, wherein
a first end of the first coil is electrically connected to a first filter input,
a second end of the third coil is electrically connected to a first filter output,
a first end of the second coil is electrically connected to a second filter output, and
a second end of the fourth coil is electrically connected to a second filter input,
a first conduction path is defined from the first filter input to the first filter output, and
a second conduction path is defined from the second filter input to the second filter output.

7. The two-stage noise filter according to claim 6, wherein
a first side of the impedance balancer is directly connected to a second end of the first coil and a first end of the third coil, and
a second side of the impedance balancer is directly connected to a second end of the second coil and a first end of the fourth coil.

8. An electronic device comprising:
a power circuit configured to generate power; and
a two-stage noise filter configured to suppress noise caused by a power line and a ground line of the power circuit, the two-stage noise filter comprising:
  a core comprising a primary side and a secondary side opposite to the primary side;
  a first filter comprising a first coil wound on the primary side of the core and a second coil wound on the secondary side of the core;
  a second filter comprising a third coil wound on the primary side of the core in series with the first coil and a fourth coil wound on the secondary side of the core in series with the second coil; and
an impedance balancer located in a middle space of the core, and configured to keep a balance of impedance between the first filter and the second filter,
wherein the first coil and the third coil define a first magnetic flux path at the primary side of the core when a first electric current flows therein,
the second coil and the fourth coil define a second magnetic flux path, and
the first magnetic flux path and the second magnetic flux path form a single closed-loop when a second electric current flows therein.

* * * * *